United States Patent
Lasich

(10) Patent No.: US 7,888,592 B2
(45) Date of Patent: Feb. 15, 2011

(54) BYPASS DIODE FOR PHOTOVOLTAIC CELLS

(75) Inventor: John Beavis Lasich, Deepdene (AU)

(73) Assignee: Solar Systems Pty Ltd., Lucas Heights, New South Wales (AU)

( * ) Notice: Subject to any disclaimer, the term of this patent is extended or adjusted under 35 U.S.C. 154(b) by 0 days.

(21) Appl. No.: 10/557,456

(22) PCT Filed: May 19, 2004

(86) PCT No.: PCT/AU2004/000667

§ 371 (c)(1),
(2), (4) Date: Nov. 13, 2006

(87) PCT Pub. No.: WO2004/102678

PCT Pub. Date: Nov. 25, 2004

(65) Prior Publication Data

US 2007/0089774 A1    Apr. 26, 2007

Related U.S. Application Data

(60) Provisional application No. 60/471,342, filed on May 19, 2003.

(51) Int. Cl.
H01L 31/00 (2006.01)

(52) U.S. Cl. .................. 136/259; 136/244; 136/251; 257/433

(58) Field of Classification Search .......... 136/244, 136/251, 256, 259; 257/433
See application file for complete search history.

(56) References Cited

U.S. PATENT DOCUMENTS

| | | | |
|---|---|---|---|
| 4,019,924 A | 4/1977 | Kurth | |
| 4,481,378 A | 11/1984 | Lesk | |
| 4,577,051 A | 3/1986 | Hartman | |
| 5,185,042 A | 2/1993 | Ferguson | |
| 5,290,366 A * | 3/1994 | Riermeier et al. | 136/244 |
| 5,616,185 A * | 4/1997 | Kukulka | 136/244 |
| 5,800,630 A * | 9/1998 | Vilela et al. | 136/249 |
| 6,020,555 A | 2/2000 | Garboushian et al. | |
| 6,313,396 B1 * | 11/2001 | Glenn | 136/244 |
| 6,531,653 B1 | 3/2003 | Glenn et al. | |
| 6,617,508 B2 | 9/2003 | Kilmer et al. | |
| 2003/0047208 A1 | 3/2003 | Glenn et al. | |

FOREIGN PATENT DOCUMENTS

| | | |
|---|---|---|
| EP | 0 768 720 A2 | 4/1997 |
| JP | 2000-277785 | 10/2000 |

* cited by examiner

*Primary Examiner*—Basia Ridley
*Assistant Examiner*—Thanh-Truc Trinh
(74) *Attorney, Agent, or Firm*—Merchant & Gould P.C.

(57) ABSTRACT

A photovoltaic power module (10), comprising a substrate (12) provided with a circuit, one or more photovoltaic cells (16) mounted to the substrate and electrically connected to the circuit, and one or more bypass diodes (20), each corresponding to a respective one or more of the cells, wherein each of the diodes is located between the substrate and the cells and between conducting portions (14) of the circuit. Solder (18) connects the bypass diode, the conducting portions, and the photovoltaic cell.

26 Claims, 2 Drawing Sheets

BYPASS DIODE FOR PHOTOVOLTAIC CELLS

RELATED APPLICATION

This application is based on and claims the benefit of the filing date of U.S. provisional application Ser. No. 60/471,342 filed 19 May 2003, the contents of which is incorporated herein by reference in its entirety.

BACKGROUND OF THE INVENTION

The present invention relates to a bypass diode for a photovoltaic cell, of particular but by no means exclusive application in photovoltaic cell modules for use in solar concentrators of solar photovoltaic power systems.

Multijunction solar cells are used in solar concentrator photovoltaic power systems for generating power owing to their high efficiency. Although such solar cells are expensive, these efficiencies are sufficiently high to render such arrangements economically feasible. However, to maintain the reliability of such arrangements in which multiple cells are arranged in series, it is desirable to have a bypass diode for each cell in a series. The bypass diode prevents overloading of its corresponding cell when that cell has a reduced power output owing to poor illumination or performance, or some other malfunction. This allows the rest of the series of cells constituting a module to continue operating.

The number of cells in series, which determines the bus voltage, is usually greater than a hundred, so the bypassing of a single, failed cell will result in a power loss of 1% or less. The bypass diodes thus allow the system to keep operating with minimal loss of output.

One existing system is illustrated in U.S. Pat. No. 6,020,555, in which each cell is connected in parallel with its corresponding bypass diode resulting in a series of diodes in parallel with a series of cells.

However, in existing arrangements, where the bypass diodes are essentially adjacent to the cells, are unsuitable for systems with closely packed cells, such as dish concentrator or central receiver systems.

SUMMARY OF THE INVENTION

The present invention provides in a first aspect a photovoltaic power module, comprising a substrate thermally couplable to a heat sink, one or more photovoltaic cells mounted to the substrate, metallised zones constituting a circuit and provided between the substrate and the cells, the metallised zones being electrically and thermally coupled to the cells, and one or more bypass diodes each corresponding to a respective one or more of the cells. Each of the diodes is located between the substrate and the cells and at least in part between conducting portions of the metallised zones to permit reduced separation between the cells and the metallised zones, and the metallised zones underlie a substantial portion of each of the cells, to facilitate heat flow from said cells to said substrate.

Preferably the circuit takes the form of a printed or laminated circuit and each of the diodes is located between neighbouring metallised zones of the circuit. Preferably each of the diodes has a thickness that is substantially equal to or less than the thickness of the metallised zones. Thus, because the diodes are located (along with the circuit) between the substrate and the cells, the diodes do not prevent the solar cells from being packed as closely as previously.

Alternatively, however, if it is not possible to obtain or employ diodes that are sufficiently thin to be accommodated by one of the metallised zones (which may have a thickness of only 0.3 mm) the substrate may include one or more recesses for at least partially (though conceivably wholly) accommodating the diodes (preferably one diode per recess). Thus, in this embodiment the diodes are also between the substrate and the cells (their still being substrate material on the side of the diodes opposite the cells), but the diodes are also at least to some extent surrounded by substrate material.

Preferably the conducting portions of the circuit (in one embodiment the metallised zones) are contoured to fit or accommodate the diodes. Preferably the terminals of each of the diodes are metallised to complement the shape of the conducting portions.

The present invention provides in a further aspect a method of bypassing one or more photovoltaic cells in a photovoltaic power module, comprising locating one or more bypass diodes, each corresponding to a respective one or more of the cells, between the cells and the substrate of the module, and at least in part between conducting portions of metallised zones constituting a circuit provided on the substrate between the substrate and the cells, electrically and thermally coupling the metallised zones to the cells such that the metallised zones underlie a substantial portion of each of the cells in order to facilitate heat flow from the cells to the substrate, and electrically coupling the bypass diodes to the metallised zones with the bypass diodes arranged to bypass a corresponding one or more cells if a voltage across the corresponding one or more cells drops below a predetermined level or is reversed.

Preferably the circuit is a printed or laminated circuit. Preferably each of the diodes is located between neighbouring metallised zones of the circuit.

Preferably the method includes contouring portions of the circuit (in one embodiment the metallised zones) to fit the diodes. Preferably the terminals of each of the diodes are metallised to complement the shape of the conducting portions.

In one embodiment, the method includes providing one or more recesses in said substrate for at least partially (and in some cases wholly) accommodating the diodes (preferably one diode per recess). Thus, in this embodiment the diodes are located between the cells and the substrate (their still being substrate material on the side of the diodes opposite the cells), but the diodes are also at least to some extent surrounded by substrate material.

BRIEF DESCRIPTION OF THE DRAWINGS

In order that the present invention may be more clearly ascertained, embodiments will now be described by way of example, with reference to the accompanying drawing, in which.

DETAILED DESCRIPTION

Figure 1:
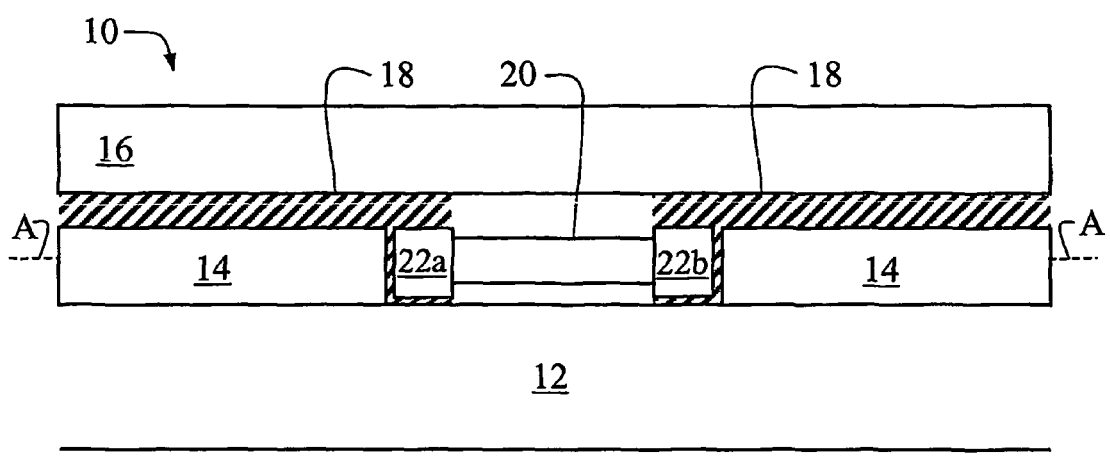
FIG. 1 is a cross-sectional view of a portion of a photovoltaic module according to an embodiment of the present invention.

A representative detail of a photovoltaic module according to an embodiment of the present invention is shown in cross-section at 10 in FIG. 1. The module includes an insulating substrate 12 with a thickness of 0.6 mm. The substrate 12 forms part of a printed circuit comprising the substrate 12 and metallised zones 14. The metallised zones 14 have a thickness of approximately 0.3 mm.

Each of a plurality of photovoltaic cells 16 is soldered to the metallised zones 14 by means of solder 18 (shown hashed in the figure). For each solar cell 16, a bypass diode 20 with terminals 22a and 22b is provided between that cell 16 and the substrate 12. Each cell 16 is connected in parallel across its respective bypass diode 20.

The diode 20 is electrically coupled to the appropriate portions of the metallised zones 14 of the circuit board by solder 18, so that it is in parallel with the corresponding cell 16.

In an alternative embodiment, the photovoltaic module includes a plurality of groups of cells. Each group of cells is then provided with a bypass diode 20, and the group of cells is connected in parallel with its corresponding bypass diode 20.

Each bypass diode 20 has a thickness approximately equal to or somewhat less than that of the metallised zones 14, hence also approximately equal to or somewhat less than 0.3 mm. The bypass diodes 20 thus do not increase the thickness of the module 10 and, being beneath the cells 16, do not restrict how closely the cells 16 can be packed in the module 10.

It is envisaged that, during manufacture, the diodes 20 would be positioned on the solder paste printed substrate 12, after which the solar photovoltaic cells 16 would be placed over the diodes 20 onto the metallised zones 14. In this manner the diode is integrated into the closely packed module 10 without requiring additional diode space around the photovoltaic cells 16.

Figure 2:
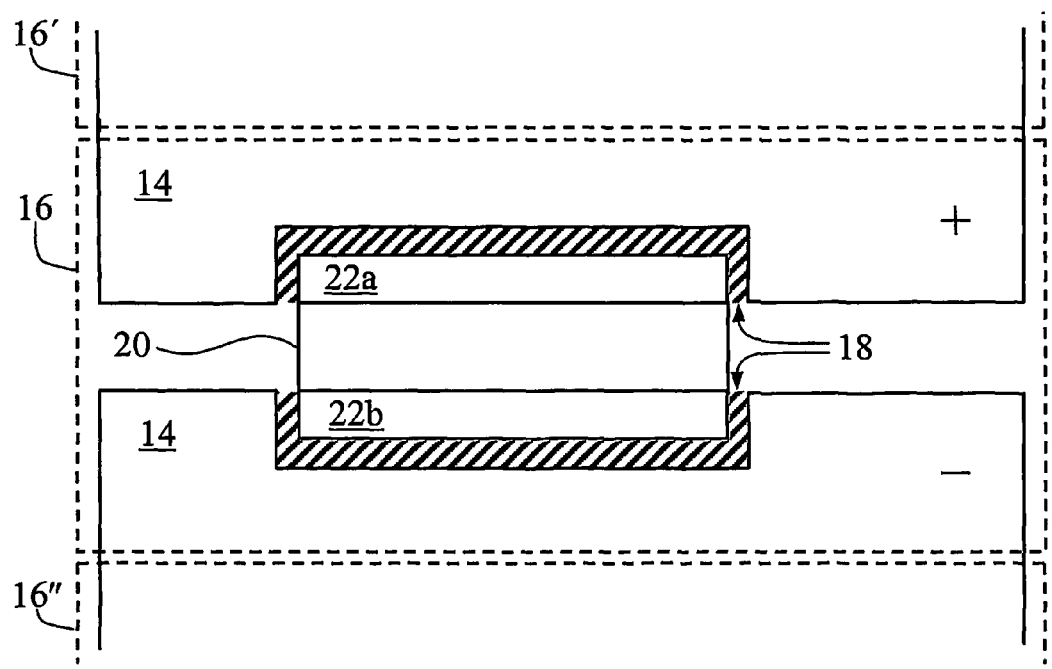
FIG. 2 is a schematic plan view of a bypass diode and adjacent metallised circuit of the module of FIG. 1.

FIG. 2 is a plan view of cross-section AA from FIG. 1, through the plane of the metallised zones 14 and the diode 20, with the alignment of solar cell 16 (or, in an alternative embodiment, cell 16 and adjacent cells 16' and 16") shown by means of a dotted lines. In this (plan) view, it will be apparent how the metallised zones 14 are shaped to accommodate the diode 20 and, in particular, terminals 22a and 22b of diode 20. Solder 18 establishes the necessary electrical contact between the diode 20 and the metallised zones 14 of the circuit board.

The device is shown schematically for the sake of clarity. In reality, the diode 20 is smaller than it appears compared with the metallised zones 14. Thus, the gap between the metallised zones 14 would typically be about 0.7 mm, widening to about 1.5 mm to accommodate the diode 20. Thus, the area without metal for the cells to be soldered to is small.

The width (from left to right in this view) of the metallised zones 14 would typically be about 15 mm, while the width (from top to bottom in this view) of cell 16 would typically be about 10 mm. Neighbouring solar cells (16, 16', 16") are thus very close.

Figure 3:
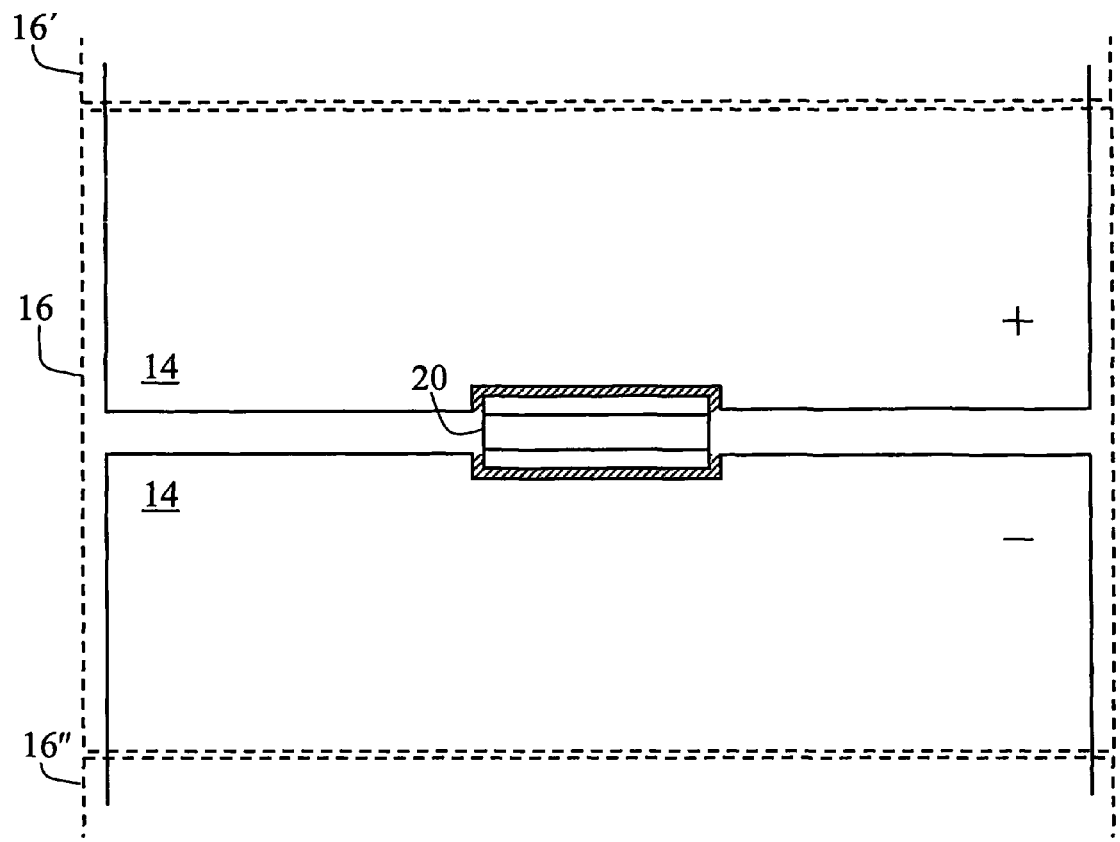
FIG. 3 is a plan view comparable to FIG. 2 but more closely to scale of the bypass diode and adjacent metallised circuit of the module of FIG. 1.

FIG. 3 is comparable to FIG. 2, but more closely to scale so that a better idea of the relative sizes of the diode, cells and metallised zones can be ascertained.

Figure 4:
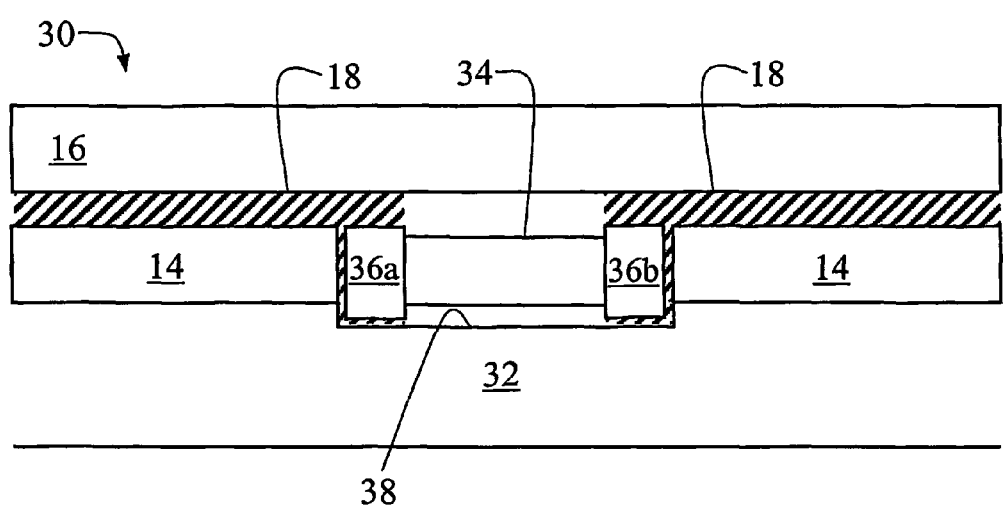
FIG. 4 is a cross-sectional view of a portion of a photovoltaic module according to another embodiment of the present invention.

FIG. 4 is a cross-sectional view (comparable to that of FIG. 1) of a representative detail 30 of a photovoltaic module according to an alternative embodiment. In this figure, like reference numerals have been used to identify like features when compared with the embodiment of FIG. 1.

As in the embodiment of FIG. 1, the diode module of this embodiment includes an insulating substrate 32 with a thickness generally of 0.6 mm. The substrate 32 forms part of a printed circuit comprising the substrate 32 and metallised zones 14. The metallised zones 14 have a thickness of approximately 0.3 mm. However, bypass diode 34 (with terminals 36a and 36b) has a thickness greater than that of diode 20 of FIG. 1 and hence greater than that of metallised zones 14. Thus, a shallow recess 38 is provided in substrate 32 in order to accommodate bypass diode 34 to a depth sufficient to ensure that bypass diode 34 does not extend upwardly beyond the metallised zones 14. The solder 18 extends downwardly into the recess 38 to a sufficient extent to ensure good electrical contact is made with terminals 36a and 36b.

This embodiment allows the use of diodes with a somewhat greater thickness than in the embodiment shown in FIG. 1, which in some applications may be desirable or necessary owing to diode availability or cost.

Thus, the bypass diode arrangement of this invention allows one to minimize the impedance of thermal transfer between the cell and the substrate. Such impedance—particularly in high intensity or high power applications—could otherwise seriously compromise performance or even render the device impractical.

Modifications within the scope of the invention may be readily effected by those skilled in the art. It is to be understood, therefore, that this invention is not limited to the particular embodiments described by way of example here and above.

In the claims that follow and in the preceding description of the invention, except where the context requires otherwise owing to express language or necessary implication, the word "comprise" or variations such as "comprises" or "comprising" is used in an inclusive sense, i.e. to specify the presence of the stated features but not to preclude the presence or addition of further features in various embodiments of the invention.

Further, any reference herein to prior art is not intended to imply that such prior art forms or formed a part of the common general knowledge.

The invention claimed is:

1. A photovoltaic power module, comprising:
a substrate thermally couplable to a heat sink;
one or more photovoltaic cells mounted to said substrate;
metallised zones formed on said substrate and constituting a circuit, said metallised zones being generally planar and underlying, in combination, substantially entirely said photovoltaic cells, and the metallised zone being electrically and thermally coupled to said respective photovoltaic cells by solder over substantially all portions of the metallised zones underlying said photovoltaic cells to facilitate heat flow from said photovoltaic cells to said substrate; and
one or more bypass diodes each corresponding to a respective one or more of said photovoltaic cells and having first and second terminals;
wherein each of said bypass diodes is located between said substrate and the corresponding one or more of said photovoltaic cells and at least in part between respective first and second mutually opposed faces of conducting portions of two adjacent of said metallised zones underlying the photovoltaic cells corresponding to the bypass diode with said first and second terminals facing and electrically coupled to said opposed faces to provide, via the bypass diode, at least a portion of an electrical path from said first opposed face of said conducting portions to said second opposed face of said conducting portions that is substantially parallel to said substrate.

2. A photovoltaic power module as claimed in claim 1, wherein said circuit comprises a printed circuit or laminated circuit and each of said bypass diodes is located between and in a common plane with neighboring metallised zones of said printed circuit or laminated circuit.

3. A photovoltaic power module as claimed in claim 1, wherein each of said bypass diodes has a thickness that is less than the thickness of said metallised zones.

4. A photovoltaic power module as claimed in claim 1, wherein the substrate includes one or more recesses for at least partially accommodating the bypass diodes.

5. A photovoltaic power module as claimed in claim 1, wherein the conducting portions are contoured to fit or accommodate said bypass diodes.

6. A photovoltaic power module as claimed in claim 5, wherein said terminals complement the shape of said conducting portions.

7. A photovoltaic power module as claimed in claim 1, wherein said bypass diodes do not protrude towards said photovoltaic cells beyond said metallised zones.

8. A photovoltaic power module as claimed in claim 1, wherein each of said bypass diodes are thermally coupled to said metallised zones via at least two cooling paths.

9. A solar concentrator including a photovoltaic power module as claimed in claim 1.

10. A photovoltaic power module as claimed in claim 1, wherein said bypass diodes are below a plane defined by an upper surface of said solder.

11. A photovoltaic power module as claimed in claim 10, wherein said bypass diodes have lower faces below a plane defined by an upper surface of said metallised zones.

12. A photovoltaic power module as claimed in claim 10, wherein said solder bonds said substrate to said bypass diodes.

13. A photovoltaic power module as claimed in claim 1, wherein said bypass diodes have lower faces proximate an upper surface of said substrate.

14. A photovoltaic power module as claimed in claim 2, wherein each of said bypass diodes has a thickness that is substantially equal to the thickness of said metallised zones.

15. A method of bypassing one or more photovoltaic cells in a photovoltaic power module, comprising:

locating one or more bypass diodes, each corresponding to a respective one or more of said photovoltaic cells and having first and second terminals, between said photovoltaic cells and a substrate of said module, at least in part between conducting portions of generally planar metallised zones formed on said substrate that constitute a circuit provided between said substrate and said photovoltaic cells, said metallised zones being generally planar and underlying, in combination, substantially entirely said photovoltaic cells;

electrically coupling said first and second terminals of said respective bypass diodes to respective first and second mutually opposed faces of said conducting portions of said metallised zones with said first and second terminals facing said opposing faces, such that said respective bypass diode provides at least a portion of a respective electrical path from said first opposed face of said conducting portions to said second opposed face of said conducting portions that is substantially parallel to said substrate, with said bypass diodes arranged to bypass a corresponding one or more photovoltaic cells of a voltage across said corresponding one or more photovoltaic cells drops below a predetermined level or is reversed, and electrically and thermally coupling said photovoltaic cells to substantially all portions of the metallised zones underlying said photovoltaic cells using solder to facilitate heat flow from said photovoltaic cells to said substrate.

16. A method as claimed in claim 15, wherein the circuit is a printed circuit or a laminated circuit.

17. A method as claimed in claim 15, including locating each of said bypass diodes between and in a common plane with neighboring metallised zones of said circuit.

18. A method as claimed in claim 15, including providing each of said bypass diodes with a thickness that is less than the thickness of the metallised zones.

19. A method as claimed in claim 15, including providing said substrate with one or more recesses for at least partially accommodating said bypass diodes.

20. A method as claimed in claim 15, including contouring portions of the circuit to fit or accommodate the bypass diodes.

21. A method as claimed in claim 15, wherein said terminals complement the shape of said conducting portions.

22. A method as claimed in claim 15, comprising locating said bypass diodes below a plane defined by an upper surface of said solder.

23. A method as claimed in claim 22, comprising locating said bypass diodes with lower faces of said bypass diodes below a plane defined by an upper surface of said metallised zones.

24. A method as claimed in claim 22, comprising bonding said substrate to said bypass diodes with said solder.

25. A method as claimed in claim 15, comprising locating said bypass diodes with lower faces of said bypass diodes proximate an upper surface of said substrate.

26. A method as claimed in claim 15, including providing each of said bypass diodes with a thickness that is substantially equal to the thickness of said metallised zones.

* * * * *